United States Patent
Jung et al.

(10) Patent No.: US 8,024,857 B2
(45) Date of Patent: Sep. 27, 2011

(54) SUBSTRATE FOR SEMICONDUCTOR PACKAGE HAVING A REINFORCING MEMBER THAT PREVENTS DISTORTIONS AND METHOD FOR FABRICATING THE SAME

(75) Inventors: Young Hy Jung, Gyeonggi-do (KR); Jae Sung Oh, Gyeonggi-do (KR); Ki Il Moon, Gyeonggi-do (KR); Ki Chae Kim, Seoul (KR); Chan Sun Lee, Seoul (KR); Jin Ho Gwon, Gyeonggi-do (KR); Jae Youn Choi, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 318 days.

(21) Appl. No.: 12/347,161

(22) Filed: Dec. 31, 2008

(65) Prior Publication Data

US 2010/0117200 A1     May 13, 2010

(30) Foreign Application Priority Data

Nov. 7, 2008   (KR) .................. 10-2008-0110459

(51) Int. Cl.
*H05K 3/02*   (2006.01)
*H05K 1/02*   (2006.01)
*H05K 1/03*   (2006.01)
*H01L 21/00*  (2006.01)
*H01L 23/13*  (2006.01)

(52) U.S. Cl. .......... 29/846; 361/737; 174/255; 438/108; 257/730

(58) Field of Classification Search ............. 29/829, 29/846; 438/106, 107, 108, 117, 125; 257/685, 257/723, 724, 730; 361/736, 737, 748, 820; 174/250, 253, 255
See application file for complete search history.

(56) References Cited

U.S. PATENT DOCUMENTS

| | | | | |
|---|---|---|---|---|
| 4,766,670 A * | 8/1988 | Gazdik et al. | .................. | 29/830 |
| 5,134,462 A * | 7/1992 | Freyman et al. | ............... | 257/688 |
| 5,687,064 A * | 11/1997 | Nichols | .......................... | 361/752 |
| 5,841,194 A * | 11/1998 | Tsukamoto | .................... | 257/729 |
| 5,889,321 A * | 3/1999 | Culnane et al. | ............... | 257/701 |
| 6,528,179 B1* | 3/2003 | Jimarez et al. | ............... | 428/620 |
| 6,586,832 B2* | 7/2003 | Shibata et al. | ................ | 257/710 |
| 6,774,472 B2* | 8/2004 | Pierson | ......................... | 257/685 |
| 6,841,862 B2* | 1/2005 | Kikuchi et al. | ............... | 257/680 |
| 2002/0149027 A1* | 10/2002 | Takahashi et al. | ............ | 257/100 |
| 2005/0285265 A1* | 12/2005 | Campbell | ..................... | 257/730 |
| 2007/0172992 A1* | 7/2007 | Grigg | .............................. | 438/125 |
| 2008/0002374 A1* | 1/2008 | Fukuzono et al. | ............ | 361/748 |

(Continued)

FOREIGN PATENT DOCUMENTS

JP   07-038230 A   2/1995

(Continued)

*Primary Examiner* — Evan Pert
(74) *Attorney, Agent, or Firm* — Ladas & Parry LLP

(57) ABSTRACT

A substrate for a semiconductor package having a reinforcing member that prevents or minimizes distortions is presented. The substrate for the semiconductor package includes a substrate body, an insulation layer, and a reinforcing member. The substrate body has a first region having a plurality of chip mount regions, a second region disposed along a periphery of the first region, a circuit pattern disposed in each chip mount region and a dummy pattern disposed along the second region. The insulation layer covers the first and second regions and has an opening exposing some portion of each circuit pattern. The reinforcing member is disposed in the second region and prevents deflection of the substrate body.

27 Claims, 14 Drawing Sheets

U.S. PATENT DOCUMENTS

2009/0116201 A1 * 5/2009 Hsieh .......................... 361/736

FOREIGN PATENT DOCUMENTS

| | | |
|---|---|---|
| JP | 09-129781 A | 5/1997 |
| JP | 10-135648 A | 5/1998 |
| JP | 10-335370 A | 12/1998 |
| JP | 2000-059018 A | 2/2000 |
| JP | 2000-228566 A | 8/2000 |
| JP | 2001-015638 A | 1/2001 |
| JP | 2001-148506 A | 5/2001 |
| JP | 2002-026198 A | 1/2002 |
| JP | 2002-076530 A | 3/2002 |
| JP | 2002-190657 A | 7/2002 |
| JP | 2004-241526 A | 8/2004 |
| JP | 2005-167141 A | 6/2005 |
| JP | 2005-285866 A | 10/2005 |
| JP | 2006-165269 A | 6/2006 |
| JP | 2006-173143 A | 6/2006 |
| JP | 2006-287056 A | 10/2006 |
| JP | 2007-180212 A | 7/2007 |
| JP | 2007-258264 A | 10/2007 |
| KR | 1020040010101 A | 1/2004 |
| KR | 1020040110985 A | 12/2004 |
| KR | 1020050106966 A | 11/2005 |
| KR | 1020060027600 A | 3/2006 |
| KR | 1020070004285 A | 1/2007 |
| KR | 1020070078590 A | 8/2007 |
| KR | 1020080018555 A | 2/2008 |

* cited by examiner

SUBSTRATE FOR SEMICONDUCTOR PACKAGE HAVING A REINFORCING MEMBER THAT PREVENTS DISTORTIONS AND METHOD FOR FABRICATING THE SAME

CROSS-REFERENCE TO RELATED APPLICATIONS

The present application claims priority to Korean patent application number 10-2008-110459 filed on Nov. 7, 2008, which is incorporated herein by reference in its entirety.

BACKGROUND OF THE INVENTION

The present invention relates to a substrate for a semiconductor package and a method for fabricating the same. More particularly, the present invention relates to a substrate for a semiconductor package having a reinforcing member which substantially prevents or minimizes distortions.

In recent, a semiconductor package including a semiconductor chip capable of storing massive data and processing the massive data and a substrate for mounting the semiconductor chip thereon has been developed.

In recent, the size of the semiconductor packages has become more and more reduced due to thinning of the thicknesses of the semiconductor chip and the substrate included in the semiconductor package.

However, as the thickness of the substrate included in the semiconductor package is reduced, a problem arises in that the rigidity of the substrate is reduced and as a result the shape of the substrate is therefore prone to distortions or deformations.

SUMMARY OF THE INVENTION

Embodiments of the present invention are directed to a substrate for a semiconductor package capable of preventing shape deformations of the substrate due to its thin thickness.

Also, embodiments of the present invention are directed to a method for fabricating a substrate for a semiconductor package capable of preventing shape deformations of the substrate due to its thin thickness.

In one embodiment, a substrate for a semiconductor package comprises a substrate body which is provided with a first region having a plurality of chip mount regions, a second region disposed along a periphery of the first region, a circuit pattern disposed in each chip mount region and a dummy pattern disposed along the second region; an insulation layer which covers the first and second regions and has an opening that exposes a portion of each circuit pattern; and a reinforcing member which is disposed in the second region and prevents or minimizes distortions of the substrate body.

The reinforcing member is disposed over the portion of the insulation layer corresponding to the second region.

The insulation layer and the reinforcing member include the same material.

The insulation layer includes a first insulating material with a first hardness and the reinforcing member includes a second insulating material with a second hardness which is higher than the first hardness.

The reinforcing member is disposed between the dummy pattern and the insulation layer.

The reinforcing member includes a metal layer.

The reinforcing member has a deflection preventing groove formed along the second region.

The reinforcing member is disposed at a first face of the substrate body formed with the insulation layer and a second face of the substrate body opposite to the first face.

In another embodiment, a method for fabricating a substrate for a semiconductor package comprises preparing a substrate body which is provided with a first region having a plurality of chip mount regions, a second region disposed along a periphery of the first region, a circuit pattern disposed in each chip mount region and a dummy pattern disposed along the second region; forming an insulation layer, which covers the first and second regions and has an opening that exposes a portion of each circuit pattern, over the substrate body; and forming a reinforcing member, which prevents or minimizes deflection or distortions of the substrate body, in the second region.

In the step of forming the reinforcing member, the reinforcing member is formed over the insulation layer.

The insulation layer and the reinforcing member are formed of the same material.

The insulation layer includes a first insulating material with a first hardness and the reinforcing member includes a second insulating material with a second hardness which is higher than the first hardness.

The method may further comprise forming an additional reinforcing member over the portion of the insulation layer corresponding to the second region.

In the step of forming the reinforcing member, the reinforcing member is formed directly over the dummy pattern.

In the step of forming the reinforcing member, the reinforcing member is a metal layer.

The method may further comprise forming a deflection preventing groove over the reinforcing member along the second region.

In further another embodiment, a method for fabricating a substrate for a semiconductor package comprises preparing a substrate body which is provided with a first region having a plurality of chip mount regions and a second region disposed along a periphery of the first region; forming a reinforcing member along the second region; forming a metal layer which is formed in the first and second regions and covers the reinforcing member; forming a circuit pattern part in each chip mount region and a reinforcing pattern part covering an upper face of the reinforcing member by patterning the metal layer; and forming an insulation layer which covers the first region and has an opening that exposes a portion of the circuit pattern.

In the step of forming the reinforcing member, the reinforcing member includes any one of an insulation layer and a metal layer formed over the portion of the substrate body corresponding to the second region.

In further another embodiment, a method for fabricating a substrate for a semiconductor package comprises preparing a substrate body which is provided with a first region having a plurality of chip mount regions, a second region disposed along a periphery of the first region and a reinforcing part bended at least one time along the second region; forming a metal layer formed in the first and second regions to cover the reinforcing part; forming a circuit pattern in each chip mount region and fixing member which covers the reinforcing part to fix the reinforcing part by patterning the metal layer; and forming an insulation layer which covers the first region and has an opening that exposes a portion of the circuit pattern.

The reinforcing part is formed by any one of a press process, an injection process and a laser beam bending process.

The reinforcing part is formed in at least one of a shape bended in a zigzag shape, a channel shape and a groove shape formed along the second region.

In further another embodiment, a method for fabricating a substrate for a semiconductor package comprises preparing a substrate body which is provided with a first region having a plurality of chip mount regions and a second region disposed along a periphery of the first region; forming a metal layer covering the first and second regions; forming a reinforcing pattern with a first thickness over the portion of the substrate body corresponding to the second region and forming a preliminary circuit pattern part with a second thickness which is thinner than the first thickness over the portion of the substrate corresponding to each chip mount region by patterning the metal layer; forming a circuit pattern in each chip mount region by patterning preliminary circuit pattern part; and forming an insulation layer which covers the first region and has an opening that exposes a portion of the circuit pattern.

In the step of forming the reinforcing pattern, a deflection preventing groove is formed over an upper face of the reinforcing member along the second region.

In further another embodiment, a method for fabricating a substrate for a semiconductor package comprises preparing a substrate body which is provided with a chip mount part having a first thickness and formed with a plurality of chip mount regions and a reinforcing pattern part formed along an edge of the chip mount part and having a second thickness thicker than the first thickness; forming a circuit pattern in each chip mount region; and forming an insulation layer which covers the chip mount region and has an opening that exposes a portion of the circuit pattern.

The step of preparing the substrate body includes preparing a preliminary substrate having the second thickness; and forming the chip mount part having the first thickness by etching the portion of the preliminary substrate corresponding to the chip mount part.

The step of preparing the substrate body includes forming a groove over the upper face of the reinforcing pattern part along the reinforcing pattern part.

In further another embodiment, a method for fabricating a substrate for a semiconductor package comprises forming a substrate body which is provided with a first region having a plurality of chip mount regions, a second region disposed along the periphery of the first region and through holes passing through the second region; forming a reinforcing member which fills the through holes and covers the second region; and forming an insulation layer which covers the first region.

In the step of forming a reinforcing member, the reinforcing member is formed of an insulator.

The step of forming the reinforcing member includes forming metal layer covering the first and second regions; and forming a circuit pattern in each chip mount region by patterning the metal layer.

In accordance with the present invention, it is possible to thereby prevent or minimize shape deformation of the substrate body by forming reinforcing members at the edge of the substrate body having very thin thickness.

DESCRIPTION OF SPECIFIC EMBODIMENTS

Hereinafter, preferred embodiments of the present invention will be described in detail with reference to accompanying drawings.

Figure 1:
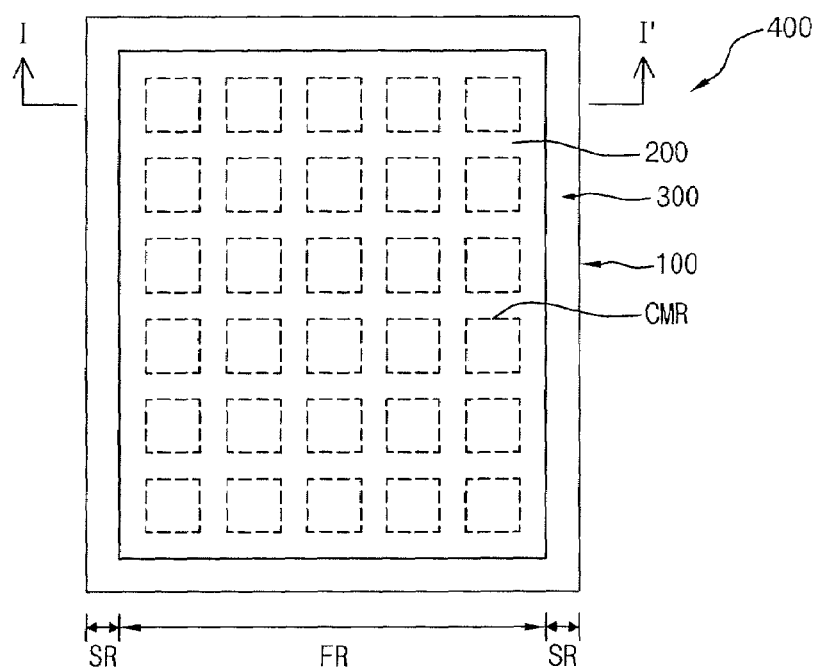
FIG. 1 is a plan view illustrating a substrate for a semiconductor package in accordance with an embodiment of the present invention.
Figure 2:
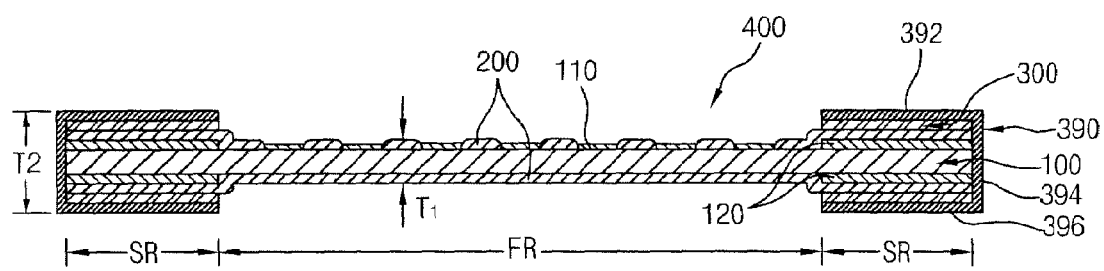
FIG. 2 is a cross-sectional view taken along a line I-I' in FIG. 1.

FIG. 1 is a plan view illustrating a substrate for a semiconductor package in accordance with an embodiment of the present invention. FIG. 2 is a cross-sectional view taken along a line I-I' in FIG. 1.

Referring to FIGS. 1 and 2, a substrate 400 for a semiconductor package includes a substrate body 100, an insulation layer 200 and a reinforcing member 300.

The substrate body 100 has, for example, a shape of a rectangular plate having a thin thickness. The substrate body 100 includes a first region FR, a second region SR, a circuit pattern 110 and a dummy pattern 120.

The first region FR is disposed, for example, at a middle of the substrate body 100. The first region FR has a shape similar to the substrate body 100 and the first region FR has an area smaller than the area of the substrate body 100. Chip mount regions CMR are formed within the first region FR and a semiconductor chip (not shown) is mounted on each chip mount region CMR.

The second region SR is disposed along a periphery of the first region FR and the second region SR has a shape of a rectangular frame when viewed from above.

The circuit pattern 110 is disposed in each chip mount region CMR and each circuit pattern 110 is electrically connected with a bonding pad (not shown) of the semiconductor chip (not shown).

The dummy pattern 120 is disposed in the second region SR. The dummy pattern 120 has, for example, substantially the same shape and size as the second region SR. The dummy pattern 120 may be disposed not only in the second region SR on an upper face of the substrate body 100 but also in the second region SR on a lower face of the substrate body 100 that is opposite to the upper face of the substrate body 100.

In the present embodiment, the circuit pattern 110 and the dummy pattern 120 may include, for example, the same metal. Alternatively, the circuit pattern 110 and the dummy pattern 120 may include different metals.

The insulation layer 200 is disposed in the first region FR and the second region SR of the upper face of the substrate body 100. The insulation layer 200 has openings that expose some portion of each circuit pattern 100 formed in the first region FR. In the present embodiment, the insulation layer 200 covers the dummy pattern 120 disposed in the second region SR. Meanwhile, the insulation layer 200 may cover the first region FR and the second region SR of the lower face that is opposite to the upper face of the substrate body 100.

In the present embodiment, the reinforcing member 300 may be disposed, for example, over the portion of the insulation layer 200 corresponding to the second region SR and the reinforcing member 300 has substantially the same shape and size as the second region SR. The reinforcing member 300 prevents or minimizes shape deformation of the substrate body 100 having a thin thickness. Meanwhile, the reinforcing member 300 may be disposed in the second region SR of the lower face of the substrate body 100.

In the present embodiment, the reinforcing member 300 disposed over the insulation layer 200 may include insulating material.

The reinforcing member 300 and the insulation layer 200 may include the same insulating material. Alternatively, the reinforcing member 300 and the insulation layer 200 may include different insulating materials. For example, the insulation layer 200 may include a first insulating material having a first hardness and the reinforcing member 300 may include a second material having a second hardness which is harder than the first hardness.

Meanwhile, the substrate 400 for a semiconductor package in accordance with the present embodiment may include an additional reinforcing member 390.

In the present embodiment, the additional reinforcing member 390 is a U-shaped channel and the additional reinforcing member 390 further prevents or minimizes shape deformation of the substrate body 100. Specifically, the additional reinforcing member 390 may include a first reinforcing part 392, a second reinforcing part 394 and a third reinforcing part 396. The first reinforcing part 392 covers the second region SR of the upper face of the substrate body 100, the third reinforcing part 396 covers the second region SR of the lower face of the substrate body 100 and the second reinforcing part 394 faces to the side face of the substrate body 100. The second reinforcing part 394 connects the first and third reinforcing parts 392, 396 to each other. In the present embodiment, the additional reinforcing member 390 may include a metal.

Referring again to FIG. 2, the portion of the substrate 400 for a semiconductor package corresponding to the first region FR has a first thickness T1 and the portion of the substrate 400 for a semiconductor package corresponding to the second region SR has a second thickness T2. The reinforcing member 300 and the additional reinforcing member 390 formed in the second region SR prevent or minimize shape deformation of the substrate 400 for a semiconductor package.

Figure 3:
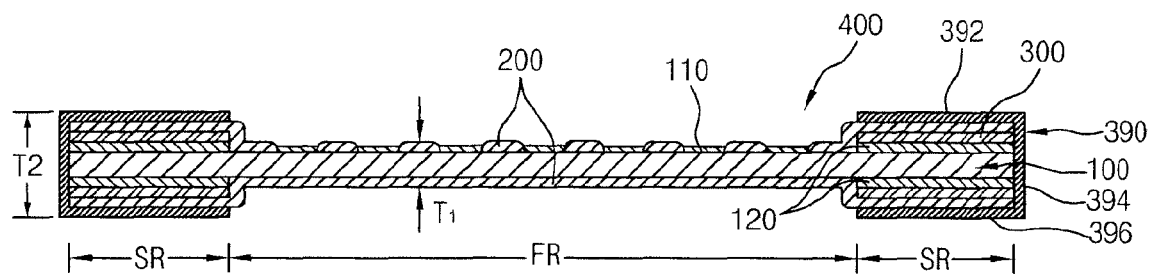
FIG. 3 is a cross-sectional view illustrating a substrate for a semiconductor package in accordance with another embodiment of the present invention.

FIG. 3 is a cross-sectional view illustrating a substrate for a semiconductor package in accordance with another embodiment of the present invention. The substrate for a semiconductor package in accordance with the present embodiment has a configuration substantially identical to the substrate for a semiconductor package described with reference to FIGS. 1 and 2 except for disposition of the reinforcing member 300. Therefore, the same name and reference numerals will be given to the same components.

Referring to FIG. 3, the substrate 400 for a semiconductor package includes the substrate body 100, the insulation layer 200 and the reinforcing member 300.

The reinforcing member 300 is disposed in the second region SR of the substrate body 200 and the reinforcing member 300 is interposed between the dummy pattern 120 and the insulation layer 200. In the present embodiment, the reinforcing member 300 may include an insulation material.

Figure 4:
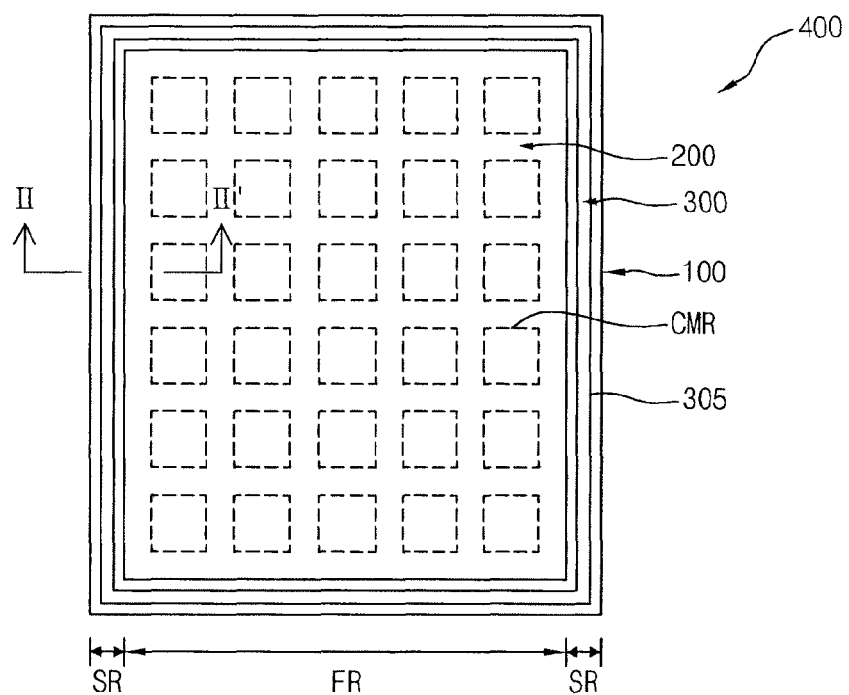
FIG. 4 is a plan view illustrating a substrate for a semiconductor package in accordance with further another embodiment of the present invention.
Figure 5:
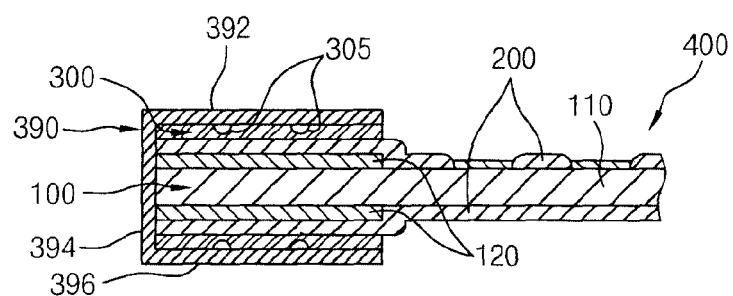
FIG. 5 is a cross-sectional view taken along a line II-II' in FIG. 4.

FIG. 4 is a plan view illustrating a substrate for a semiconductor package in accordance with yet another embodiment of the present invention. FIG. 5 is a cross-sectional view taken along a line II-II' in FIG. 4.

The substrate for a semiconductor package in accordance with the present embodiment has a configuration substantially identical to the substrate for a semiconductor package described with reference to FIGS. 1 and 2 except for deflection preventing groove 305 formed at the reinforcing member 300. Therefore, the same name and reference numerals will be given to the same components.

Referring to FIGS. 4 and 5, the substrate 400 for a semiconductor package includes the substrate body 100, the insulation layer 200 and the reinforcing member 300.

In the present embodiment, the reinforcing member 300 has a metal layer having strength higher than that of the insulation layer 200. The reinforcing member 300 including the metal layer further includes a deflection preventing groove 305.

The deflection preventing groove 305 may be formed, for example, on the upper face of the reinforcing member 300. The deflection preventing groove 305 is disposed, for example, in a shape of a closed loop along the second region SR. The deflection preventing groove 305 further prevents or minimizes shape deformation of the substrate 400 for a semiconductor package. In the present embodiment, the deflection preventing groove 305 may be formed at a lower face of each reinforcing member 300 which is opposite to an upper face of the reinforcing member 300.

Figure 6:
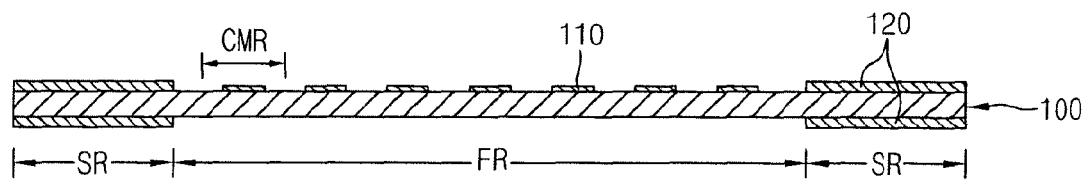
FIGS. 6 through 8 are cross-sectional views illustrating the steps of a method for fabricating a substrate for a semiconductor package in accordance with an embodiment of the present invention.
Figure 7:
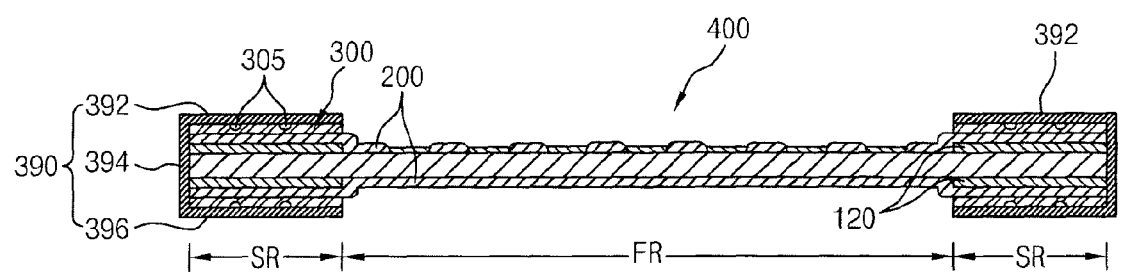

FIGS. 6 through 7 are cross-sectional views illustrating the steps of a method for fabricating a substrate for a semiconductor package in accordance with an embodiment of the present invention.

Referring to FIG. 6, the substrate body 100 is prepared in order to fabricate the substrate for a semiconductor package.

The substrate body 100 has, when viewed from above, a rectangular shape, and the first region FR formed with a plurality of the chip mount regions CMR and second regions SR are formed in the substrate body 100. The chip mount regions CMR are formed in the first region FR in a form of a matrix.

The first region FR is formed at a middle of the substrate body 100 and has, when viewed from above, a rectangular shape. The second region SR is formed along a periphery of the first region FR and the second region SR has, when viewed from above, a shape of a rectangular frame.

A metal layer (not shown) is formed in the first region FR and the second region SR of the upper face of the substrate body 100.

The metal layer is patterned by using photolithography or the like, and thus a circuit pattern 110 is formed in each chip mount region CMR of the substrate body 100 and a dummy pattern 120 is formed in the second region SR of the upper face of the substrate body 100. The dummy pattern 120 may have substantially the same shape and size as the second region SR.

Meanwhile, the dummy pattern 120 may also be formed in the second region SR of the lower face of the substrate body 100 which is opposite to the upper face of the substrate body 100.

Referring to FIG. 7, the insulation layer 200 is formed in the first region FR and the second region SR of the upper face of the substrate body 100, and the insulation layer 200 covers the circuit pattern 110 formed in the first region FR of the substrate body 100 and the dummy pattern formed in the second region SR of the substrate body 100.

After the insulation layer 200 covers the first and second regions FR, SR of the substrate body 100, the insulation layer 200 is patterned by using a photolithography process. As a result, an opening that exposes some portion of the circuit pattern 120 formed in each chip mount region CMR is formed over the portion of the insulation layer 200 corresponding to the first region FR After the insulation layer 200 is formed over the substrate body 100, the reinforcing member 300 is formed over the portion of the insulation layer 200 corresponding to the second region SR. In order to form the reinforcing member 300, a reinforcing layer (not shown) including an insulating material or a metal which is formed over the insulation layer 200.

After the reinforcing layer is formed over the insulation layer 200, the reinforcing layer is patterned, for example, by using a photolithography process, thereby forming the reinforcing member 300 over the insulation layer 200. In the present embodiment, the reinforcing member 300 may comprise an insulation pattern or a metal pattern.

In the present embodiment, when the reinforcing member 300 is an insulation pattern, the reinforcing member 300 and the insulation layer 200 may include the same insulating material. Alternatively, when the reinforcing member 300 is an insulation pattern, the reinforcing member 300 and the insulation layer 200 may include different insulating materials. In the present embodiment, when the reinforcing member 300 and the insulation layer 200 include different insulating materials, the insulation layer 200 includes the first insulation material having the first hardness and the reinforcing member 300 include the second insulation material having the second hardness higher than the first hardness.

Over the upper face of the reinforcing member 300, the deflection preventing groove 305 having a shape of a closed loop along the second region SR may be formed by an etching process, a press process, a laser etching process or the like.

The deflection preventing groove 305 further prevents or minimizes shape deformation of the substrate body 100 which has a thin thickness.

In the present embodiment, the reinforcing member 300 having the deflection preventing groove 305 may be formed not only over the upper face of the substrate body 100 formed with the circuit pattern 110 but also formed in the second region SR of the lower face of the substrate body 100 that is opposite to the upper face of the substrate body 100.

After the reinforcing member 300 is formed over the insulation layer 200, the additional reinforcing member 390 having the first and third reinforcing parts 392, 396 disposed over the reinforcing members 300 disposed at the upper face and the lower face of the substrate body 100 and the second reinforcing part 394 facing to the side face of the substrate body 100 are all coupled to the substrate body 100. The additional reinforcing member 390 further prevents or minimizes shape deformation of the substrate body 100.

Figure 8:
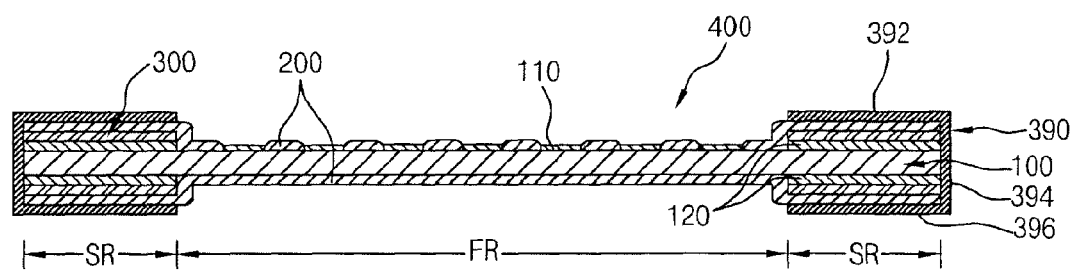

FIG. 8 is a cross-sectional view illustrating a method for fabricating a substrate for a semiconductor package in accordance with another embodiment of the present invention. The method for fabricating a substrate for a semiconductor package in accordance with the present embodiment is substantially identical to the method for fabricating a substrate for a semiconductor package described with reference to FIGS. 6 and 7 except for disposition of the reinforcing member 300. Therefore, duplicated description to the same components will be omitted and the same name and reference numerals will be given to the same components.

Referring to FIG. 8, after the circuit pattern 110 is formed in each chip mount region CMR of the first region FR and the dummy pattern 120 is formed in the second region SR, the reinforcing member 300 may then be formed over the dummy pattern 120. In the present embodiment, the reinforcing member 300 has substantially the same shape and size as that of the dummy pattern 120.

After the reinforcing member 300 is formed over the dummy pattern 120, the insulation layer 120 that covers the reinforcing member 300 and the circuit pattern 110 then is formed.

Figure 9:
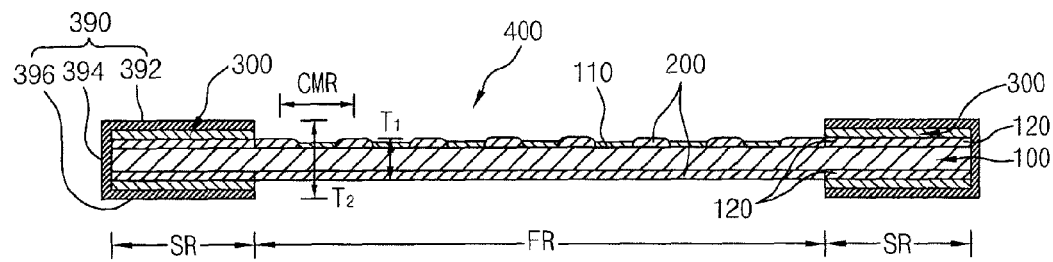
FIG. 9 is a cross-sectional view illustrating a substrate for a semiconductor package in accordance with another embodiment of the present invention.

FIG. 9 is a cross-sectional view illustrating a substrate for a semiconductor package in accordance with another embodiment of the present invention.

Referring to FIG. 9, the substrate 400 for a semiconductor chip includes the substrate body 100, the insulation layer 200 and the reinforcing member 300. In addition, the substrate 400 for a semiconductor chip may further include additional reinforcing member 390.

The substrate body 100 has, for example, a shape of a rectangular plate having a thin thickness. The substrate body 100 includes a first region FR, a second region SR, a circuit pattern 110 and a dummy pattern 120.

The first region FR is disposed, for example, at a middle of the substrate body 100. The first region FR has a shape similar to the substrate body 100 and the first region FR has an area smaller than the area of the substrate body 100. Chip mount regions CMR are formed within the first region FR and a semiconductor chip (not shown) is mounted on each chip mount region CMR.

The second region SR is disposed along a periphery of the first region FR and the second region SR has a shape of a rectangular frame when viewed from above.

The circuit pattern 110 is disposed in each chip mount region CMR and each circuit pattern 110 is electrically connected with a bonding pad (not shown) of the semiconductor chip (not shown).

The dummy pattern 120 is disposed in the second region SR. The dummy pattern 120 has, for example, substantially the same shape and size as the second region SR. The dummy pattern 120 may be disposed not only in the second region SR on an upper face of the substrate body 100 but may also be disposed in the second region SR on a lower face of the substrate body 100 that is opposite to the upper face of the substrate body 100.

In the present embodiment, the circuit pattern 110 and the dummy pattern 120 may include, for example, the same metal. Alternatively, the circuit pattern 110 and the dummy pattern 120 may include different metals.

The insulation layer 200 is disposed in the first region FR. In the present embodiment, the second region SR does not include the insulation layer 200. The insulation layer 200 selectively formed in the first region FR has openings that expose portions of the circuit pattern 110.

The reinforcing member 300 may be disposed, for example, over the portion of the insulation layer 200 corresponding to the second region SR and the reinforcing member 300 may have substantially the same shape and size as the second region SR. The reinforcing member 300 prevents or minimizes shape deformation of the substrate body 100 having a thin thickness. Meanwhile, the reinforcing member 300 may be disposed in the second region SR of the lower face of the substrate body 100.

In the present embodiment, the reinforcing member 300 disposed over the insulation layer 200 may include an insulating material or a metal.

The additional reinforcing member 390 is a U-shaped channel and the additional reinforcing member 390 further aids in preventing or minimizing shape deformation of the substrate body 100. Specifically, the additional reinforcing member 390 may include the first reinforcing part 392, the second reinforcing part 394 and the third reinforcing part 396. The first reinforcing part 392 covers the second region SR of the upper face of the substrate body 100. The third reinforcing part 396 covers the second region SR of the lower face of the substrate body 100 and covers the second reinforcing part 394 disposed at an upper portion of the side faces of the substrate body 100. The second reinforcing part 394 connects together the first and third reinforcing parts 392, 396 with each other. In the present embodiment, the additional reinforcing member 390 may include a metal.

The portion of the substrate 400 for a semiconductor package corresponding to the first region FR has a first thickness T1 and the portion of the substrate 400 for a semiconductor package corresponding to the second region SR has a second thickness T2. It is possible to thereby prevent or to minimize shape deformation of the substrate 400 for a semiconductor package by implementing the reinforcing member 300 and the additional reinforcing member 390 formed in the second region SR.

Figure 10:
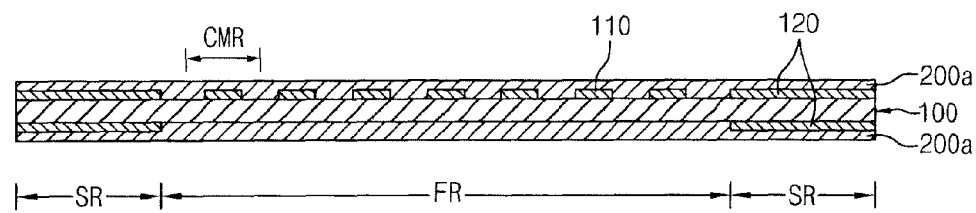
FIGS. 10 and 11 are cross-sectional views illustrating the steps of a method for fabricating a substrate for a semiconductor package shown in FIG. 9.
Figure 11:
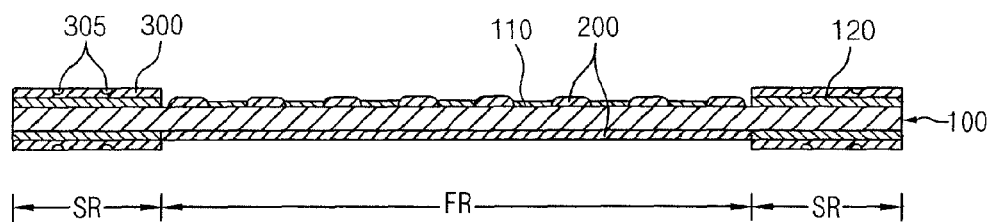

FIGS. 10 and 11 are cross-sectional views illustrating the steps of a method for fabricating a substrate for a semiconductor package shown in FIG. 9.

Referring to FIG. 10, the substrate body 100 is prepared in order to fabricate the substrate for a semiconductor package.

The substrate body 100 has, when viewed from above, a rectangular shape, and a first region FR formed with a plurality of the chip mount regions CMR and second regions SR are formed in the substrate body 100. The chip mount regions CMR are formed in the first region FR in a form of a matrix.

The first region FR is formed at a middle of the substrate body 100 and has, when viewed from above, a rectangular shape. The second region SR is formed along a periphery of the first region FR and the second region SR has, when viewed from above, a shape of a rectangular frame.

A metal layer (not shown) is formed in the first region FR and the second region SR of the upper face of the substrate body 100.

The metal layer is patterned by using a photolithography or the like, and thus a circuit pattern 110 is formed in each chip mount region CMR in the first region FR of the upper face of the substrate body 100 and a dummy pattern 120 is formed in the second region SR of the upper face of the substrate body 100. The dummy pattern 120 may have substantially the same shape and size as the second region SR.

Meanwhile, the dummy pattern 120 may also be formed in the second region SR of the lower face of the substrate body 100 which is opposite to the upper face of the substrate body 100.

A preliminary insulation layer 200a is formed in the first region FR and the second region SR of the upper face of the substrate body 100. The preliminary insulation layer 200a may be formed, for example, by a spin coating process.

Referring FIG. 11, after the preliminary insulation layer 200a is formed in the first and second regions FR, SR of the substrate body 100, the preliminary insulation layer 200a is patterned by using a photolithography process. As a result, a portion of the preliminary insulation layer 200a corresponding to the second region SR is removed from the substrate body 100 and a portion of the preliminary insulation layer 200a corresponding to the first region FR, i.e. the insulation layer 200 in the present embodiment is formed with an opening that exposes a portion of the circuit pattern 120 formed in each chip mount region CMR. In the present embodiment, the insulation layer 200 may be formed in the first region FR of the lower face of the substrate body 100.

After the insulation layer 200 that corresponds to the first region 200 is formed over the substrate body 100, the reinforcing member 300 is formed over the dummy pattern 120 corresponding to the second region SR. In order to form the reinforcing member 300, a reinforcing layer (not shown) including an insulating material or a metal is formed over the first region FR and the second region SR. In the present embodiment, the reinforcing layer covers the dummy pattern 120 and the insulation layer 200.

Referring to FIG. 9, after the reinforcing layer is formed over the insulation layer 200, the reinforcing layer is patterned, for example, by using a photolithography process, thereby forming the reinforcing member 300 over the dummy pattern corresponding to the second region SR. In the present embodiment, the reinforcing member 300 may be an insulation pattern or a metal pattern.

Meanwhile, over the upper face of the reinforcing member 300, the deflection preventing groove 305 having a shape of a closed loop along the second region SR may be formed by an etching process, a press process, a laser etching process or the like. The deflection preventing groove 305 further prevents or minimizes shape deformation of the substrate body 100 having a thin thickness.

In the present embodiment, the reinforcing member 300 having the deflection preventing groove 305 may be formed not only over the upper face of the substrate body 100 formed with the circuit pattern 110 but also in the second region SR of the lower face of the substrate body 100 that is opposite to the upper face of the substrate body 100.

Referring again to FIG. 9, after the reinforcing member 300 is formed over the dummy pattern 120, the additional reinforcing member 390 having the first and third reinforcing parts 392, 396 disposed over the reinforcing members 300 disposed at the upper face and the lower face of the substrate body 100 and the second reinforcing part 394 facing the side face of the substrate body 100 are coupled to the substrate body 100. The additional reinforcing member 390 further prevents or minimizes shape deformation of the substrate body 100.

Figure 12:
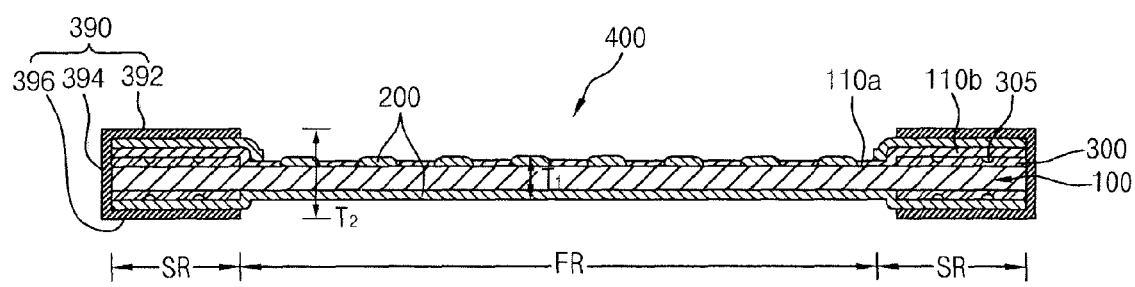
FIG. 12 is a cross-sectional view illustrating a substrate for a semiconductor package in accordance with further another embodiment of the present invention.

FIG. 12 is a cross-sectional view illustrating a substrate for a semiconductor package in accordance with further another embodiment of the present invention.

Referring to FIG. 12, the substrate 400 for a semiconductor chip includes the substrate body 100, the insulation layer 200 and the reinforcing member 300. In addition, the substrate 400 for a semiconductor chip may further include an additional reinforcing member 390.

The substrate body 100 has, for example, a shape of a rectangular plate having a thin thickness. The substrate body 100 includes a first region FR, a second region SR, a circuit pattern part 110a and a reinforcing pattern part 110b.

The first region FR is disposed, for example, at a middle of the substrate body 100. The first region FR has a shape similar to the substrate body 100 and the first region FR has an area smaller than the area of the substrate body 100. Chip mount regions CMR are formed within the first region FR and a semiconductor chip (not shown) is mounted on each chip mount region CMR.

The second region SR is disposed along a periphery of the first region FR and the second region SR has a shape of a rectangular frame when viewed from above.

The circuit pattern part 110a is disposed in each chip mount region CMR and each circuit pattern part 110a is electrically connected with a bonding pad (not shown) of the semiconductor chip (not shown).

The reinforcing pattern part 110b is disposed in the second region SR. The reinforcing pattern part 110b has, for example, substantially the same shape and size as the second region SR.

In the present embodiment, the circuit pattern parts 110a disposed in the chip mount region CMR adjacent to the second region SR among the chip mount regions CMR disposed in the first region FR are electrically connected to the reinforcing pattern part 110b.

In the present embodiment, the circuit pattern parts 110a disposed in the chip mount region CMR adjacent to the second region SR among the chip mount regions CMR disposed in the first region FR are formed integrally with the reinforcing pattern part 110b. In the present embodiment, the circuit pattern part 110a and the reinforcing pattern part 110b include, for example, the same metal. In the present embodiment, it is possible to firstly prevent or at least minimize shape deformation of the substrate body 100 having a thin thickness by forming the circuit pattern part 110a and the reinforcing pattern part 110b integrally with each other.

The reinforcing member 300 is disposed in the second region SR of the substrate body 100. The reinforcing member 300 may have substantially the same shape and size as the second region SR. The reinforcing member 300 is interposed between the reinforcing pattern part 110b and the upper face of the substrate body 100. Alternatively, the reinforcing member 300 may be disposed over the upper face of the insulation layer 200 which will be described later. The reinforcing member 300 secondarily prevents or minimizes shape deformation of the substrate body 100 having a thin thickness. Meanwhile, the reinforcing member 300 may be disposed in the second region SR of the lower face of the substrate body 100.

The insulation layer 200 is disposed in the first region FR and the second region SR of the upper face of the substrate body 100. The insulation layer 200 has openings that expose some portion of each circuit pattern 100 formed in the first region FR. In the present embodiment, the insulation layer 200 covers the dummy pattern 120 disposed in the second region SR. Meanwhile, the insulation layer 200 may cover the first region FR and the second region SR of the lower face that is opposite to the upper face of the substrate body 100.

The additional reinforcing member 390 is a U-shaped channel and the additional reinforcing member 390 tertiarily prevents or minimizes shape deformation of the substrate body 100. Specifically, the additional reinforcing member 390 may include a first reinforcing part 392, a second reinforcing part 394 and a third reinforcing part 396. The first reinforcing part 392 covers the second region SR of the upper face of the substrate body 100, the third reinforcing part 396 covers the second region SR of the lower face of the substrate body 100 and the second reinforcing part 394 is disposed at an upper portion of the side faces of the substrate body 100. The second reinforcing part 394 connects the first and third reinforcing parts 392, 396 with each other. In the present embodiment, the additional reinforcing member 390 may include metal.

The portion of the substrate 400 for a semiconductor package corresponding to the first region FR has a first thickness T1 and the portion of the substrate 400 for a semiconductor package corresponding to the second region SR has a second thickness T2. By the reinforcing member 300 and the additional reinforcing member 390, it is possible to thereby prevent or at least minimize shape deformation of the substrate 400 for a semiconductor package.

Figure 13:
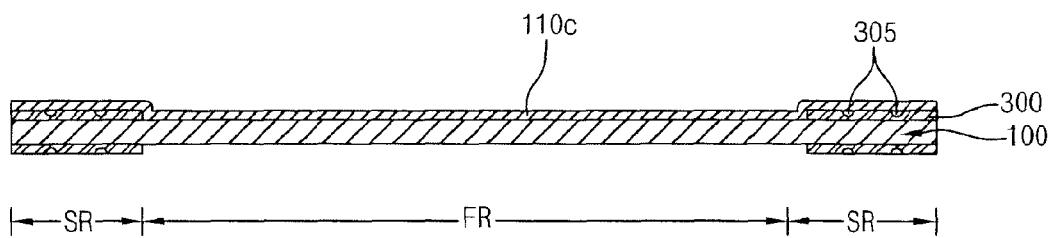
FIGS. 13 through 15 are cross-sectional views illustrating the steps of a method for fabricating a substrate for a semiconductor package in accordance with an embodiment of the present invention.
Figure 14:
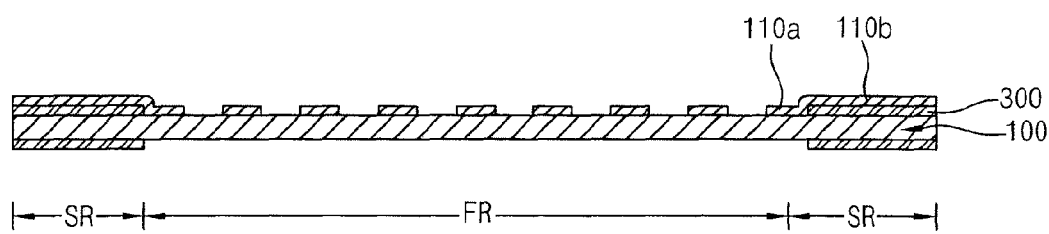
Figure 15:
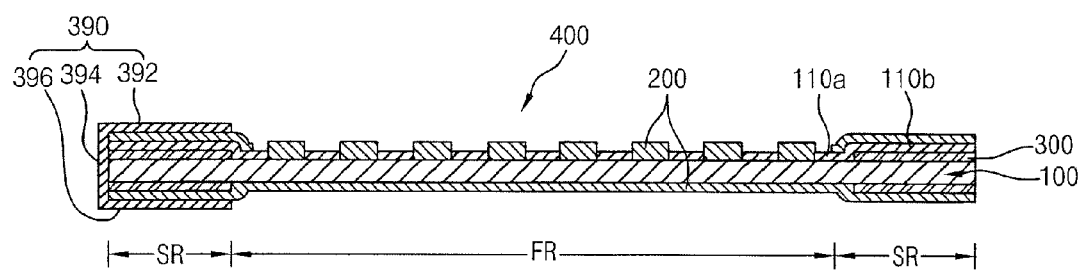

FIGS. 13 through 15 are cross-sectional views illustrating some of the steps of a method for fabricating a substrate for a semiconductor package in accordance with an embodiment of the present invention.

Referring to FIG. 13, the substrate body 100 is first prepared in order to fabricate the substrate for a semiconductor package.

The substrate body 100 has, when viewed from above, a rectangular shape, and a first region FR formed with a plurality of the chip mount regions CMR and second regions SR are formed in the substrate body 100. The chip mount regions CMR are formed in the first region FR in a form of a matrix.

The first region FR is formed at a middle of the substrate body 100 and has, when viewed from above, a rectangular shape. The second region SR is formed along a periphery of the first region FR and the second region SR has, when viewed from above, a shape of a rectangular frame.

A reinforcing member 300 is first formed in the second region SR of the upper face of the substrate body 100.

In order to form the reinforcing member 300, a reinforcing layer (not shown) including insulating material or metal is formed over the portion of the upper face of the substrate body corresponding to the second region SR.

After the reinforcing layer is formed, the reinforcing layer is patterned, for example, by using a photolithography process, thereby forming the reinforcing member 300 over the portion of the upper face of the substrate body corresponding to the second region SR. In the present embodiment, the reinforcing member 300 may be an insulation pattern or a metal pattern.

After the reinforcing member 300 is formed in the second region SR of the substrate body 100, over the upper face of the reinforcing member 300, the deflection preventing groove 305 having a shape of a closed loop along the second region SR may be formed by an etching process, a press process, a laser etching process or the like. The deflection preventing groove 305 further prevents or minimizes shape deformation of the substrate body 100 having a thin thickness.

In the present embodiment, the reinforcing member 300 having the deflection preventing groove 305 may be formed not only over the upper face of the substrate body 100 but also in the second region SR of the lower face of the substrate body 100 that is opposite to the upper face of the substrate body 100.

After the reinforcing member 300 is formed in the second region SR of the substrate body 100, a metal layer 110c is formed over the upper face of the substrate body 100. The metal layer 110c cover the both the first region FR and the second region SR and the reinforcing member 300 is thus covered by the metal layer 110c.

Referring to FIG. 14, after the metal layer (not shown) is formed in the first region FR and the second region SR of the upper face of the substrate body 100, the metal layer is patterned by using a photolithography process, thereby forming the circuit pattern part 110a in each chip mount region CMR in the first region FR and the reinforcing pattern part 110b in the second region SR of the upper face of the substrate body 100, respectively. The reinforcing pattern part 110b may have substantially the same shape and size as the second region SR.

The circuit pattern parts 110a disposed in the chip mount region CMR adjacent to the second region SR among the chip mount regions CMR disposed in the first region FR are electrically connected with the reinforcing pattern part 110b. In the present embodiment, the circuit pattern parts 110a and the reinforcing pattern part 110b are formed integrally with each other. In the present embodiment, the reinforcing pattern part 110b formed integrally with the circuit pattern parts 110a prevents or minimizes shape deformation of the substrate body 100.

Referring to FIG. 15, the insulation layer 200 is formed over the first region FR and the second region SR of the upper face of the substrate body 100 and the circuit pattern part 110a formed in the first region FR of the substrate body 100 and the reinforcing pattern part 110b formed in the second region SR are thus covered by the insulation layer 200.

After the insulation layer 200 is formed in the first and second regions FR, SR of the substrate body 100, the insulation layer 200 is patterned by using a photolithography process, thereby forming an opening that exposes some portion of the circuit pattern part 110a formed in each chip mount region CMR in the portion of the insulation layer 200 corresponding to the first region FR.

After the insulation layer 200 is formed over the substrate body 100, the additional reinforcing member 390 having the first and third reinforcing parts 392, disposed at the upper face and the lower face of the substrate body 100 and the second reinforcing part 394 facing to the side face of the substrate body 100 is coupled to the substrate body 100. The additional reinforcing member 390 further prevents or minimizes shape deformation of the substrate body 100.

Figure 16:
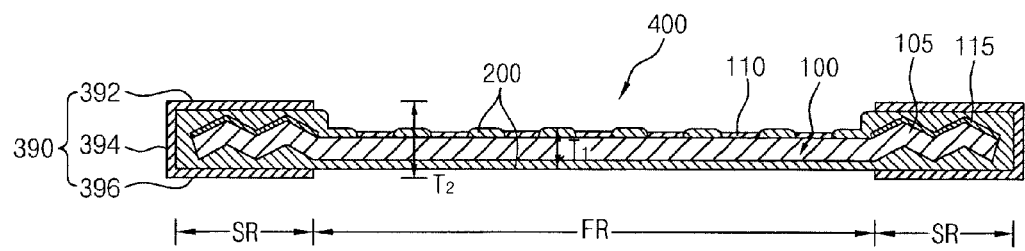
FIG. 16 is a cross-sectional view illustrating a substrate for a semiconductor package in accordance with further another embodiment of the present invention.

FIG. 16 is a cross-sectional view illustrating a substrate for a semiconductor package in accordance with further another embodiment of the present invention.

Referring to FIG. 16, the substrate 400 for a semiconductor chip includes the substrate body 100, the insulation layer 200 and the reinforcing member 300. In addition, the substrate 400 for a semiconductor chip further includes an additional reinforcing member 390.

The substrate body 100 has, for example, a shape of a rectangular plate having a thin thickness. The substrate body 100 includes the first region FR, the second region SR, the circuit pattern 110, a reinforcing part 105 and a fixing member 115.

The first region FR is disposed, for example, at a middle of the substrate body 100. The first region FR has a shape similar to the substrate body 100 and the first region FR has an area smaller than the area of the substrate body 100. Chip mount regions CMR are formed within the first region FR and a semiconductor chip (not shown) is mounted on each chip mount region CMR.

The second region SR is disposed along a periphery of the first region FR and the second region SR has a shape of a rectangular frame when viewed from above.

The circuit pattern 110 is disposed in each chip mount region CMR and each circuit pattern 110 is electrically connected with a bonding pad (not shown) of the semiconductor chip (not shown).

The reinforcing part 105 is disposed in the second region SR. The reinforcing part 105 is formed by bending the portion of the substrate body 100 corresponding to the second region SR at least one time. In the present embodiment, the reinforcing part 105 is formed in a zigzag shape in the portion of the substrate body 100 corresponding to the second region SR. The reinforcing part 105 prevents or minimizes shape deformation of the substrate body 100 having a thin thickness.

The fixing member 115 covers the reinforcing part 105 to prevent or minimize the reinforcing part 105 from being straightened or folded. In the present embodiment, the fixing member 115 may include metal or insulating material. An upper face of the fixing member 115 is formed, for example, in an even manner.

The insulation layer 200 is disposed in the first region FR and the second region SR of the upper face of the substrate body 100. The insulation layer 200 has an opening that exposes some portion of each circuit pattern 110 formed in the first region FR. In the present embodiment, the insulation layer 200 covers the reinforcing part 105 disposed in the second region SR. Meanwhile, the insulation layer 200 may cover the first region FR and the second region SR of the lower face of the substrate body 100 that is opposite to the upper face of the substrate body 100.

Meanwhile, the substrate 400 for a semiconductor package in accordance with the present embodiment may include the additional reinforcing member 390.

In the present embodiment, the additional reinforcing member 390 is a U-shaped channel and the additional reinforcing member 390 further prevents or minimizes shape deformation of the substrate body 100. Specifically, the additional reinforcing member 390 may include a first reinforcing part 392, a second reinforcing part 394 and a third reinforcing part 396. The first reinforcing part 392 covers the second region SR of the upper face of the substrate body 100, the third reinforcing part 396 covers the second region SR of the lower face of the substrate body 100 and the second reinforcing part 394 is disposed at an upper portion of the side faces of the substrate body 100. The second reinforcing part 394 connects the first and third reinforcing parts 392, 396 with each other. The first reinforcing part 392 and the third reinforcing part 396 are disposed over the portions of the reinforcing part 105 disposed at the upper face and lower face of the substrate body 100. In the present embodiment, the additional reinforcing member 390 may include a metal.

The portion of the substrate 400 for a semiconductor package corresponding to the first region FR has a first thickness T1 and the portion of the substrate 400 for a semiconductor package corresponding to the second region SR has a second thickness T2 thicker than the first thickness T1. By the reinforcing part 105, the fixing member 115 and the additional reinforcing member 390 formed in the second region SR, it is possible to thereby prevent or to minimize shape deformation of the substrate 400 for a semiconductor package.

Figure 17:
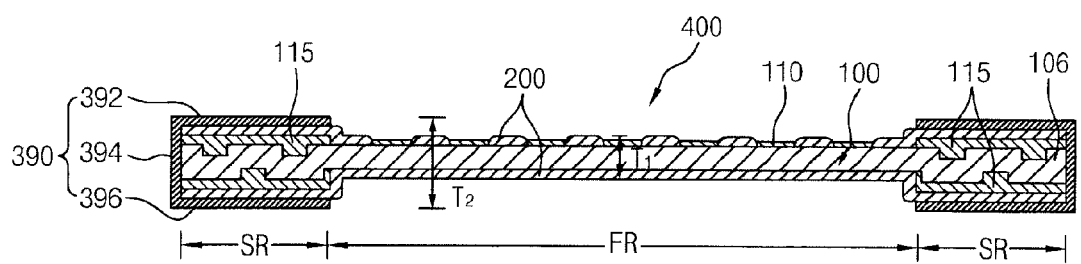
FIG. 17 is a cross-sectional view illustrating a substrate for a semiconductor package in accordance with further another embodiment of the present invention.

FIG. 17 is a cross-sectional view illustrating a substrate for a semiconductor package in accordance with further another embodiment of the present invention.

Referring to FIG. 17, the substrate 400 for a semiconductor package includes the substrate body 100 and the insulation layer 200. In addition, the substrate 400 for a semiconductor may further include an additional reinforcing member 390.

The substrate body 100 has, for example, a shape of a rectangular plate having a thin thickness. The substrate body 100 includes a first region FR, a second region SR, the circuit pattern 110, a reinforcing part 106 and a fixing member 115.

The first region FR is disposed, for example, at a middle of the substrate body 100. The first region FR has a shape similar to the substrate body 100 and the first region FR has an area smaller than the area of the substrate body 100. Chip mount regions CMR are formed within the first region FR and a semiconductor chip (not shown) is mounted on each chip mount region CMR.

The second region SR is disposed along a periphery of the first region FR and the second region SR has a shape of a rectangular frame when viewed from above.

The circuit pattern 110 is disposed in each chip mount region CMR and each circuit pattern 110 is electrically connected with a bonding pad (not shown) of the semiconductor chip (not shown).

The reinforcing part 105 is disposed in the second region SR. The reinforcing part 105 has trenches formed at the portion of the upper face of the substrate body 100 and the portion of the lower face of the substrate body 100 opposite to the upper face, which correspond to the second region SR. The trenches formed at the upper face and the lower face of the substrate body 100 are formed alternately to each other.

The reinforcing part 106 prevents or minimizes shape deformation of the substrate body 100 having a thin thickness.

The fixing member 115 covers the reinforcing part 106 to prevent or to minimize the reinforcing part 106 from being straightened or folded. In the present embodiment, the fixing member 115 may include metal or insulating material. An upper face of the fixing member 115 is formed, for example, evenly over the reinforcing part 106.

The insulation layer 200 is disposed in the first region FR and the second region SR of the upper face of the substrate body 100. The insulation layer 200 has an opening that exposes some portion of each circuit pattern 110 formed in the first region FR. In the present embodiment, the insulation layer 200 covers the reinforcing part 106 disposed in the second region SR. Meanwhile, the insulation layer 200 may cover the first region FR and the second region SR of the lower face of the substrate body 100 that is opposite to the upper face of the substrate body 100.

Meanwhile, the substrate 400 for a semiconductor package in accordance with the present embodiment may include the additional reinforcing member 390.

In the present embodiment, the additional reinforcing member 390 is a U-shaped channel and the additional reinforcing member 390 further prevents or minimizes shape deformation of the substrate body 100. Specifically, the additional reinforcing member 390 may include a first reinforcing part 392, a second reinforcing part 394 and a third reinforcing part 396. The first reinforcing part 392 covers the second region SR of the upper face of the substrate body 100, the third reinforcing part 396 covers the second region SR of the lower face of the substrate body 100 and the second reinforcing part 394 is disposed at an upper portion of the side faces of the substrate body 100. The second reinforcing part 394 connects the first and third reinforcing parts 392, 396 with each other. The first reinforcing part 392 and the third reinforcing part 396 are disposed over the portions of the reinforcing part 106 disposed at the upper face and lower face of the substrate body 100. In the present embodiment, the additional reinforcing member 390 may include metal.

The portion of the substrate 400 for a semiconductor package corresponding to the first region FR has a first thickness T1 and the portion of the substrate 400 for a semiconductor package corresponding to the second region SR has a second thickness T2 thicker than the first thickness T1. By the reinforcing part 106, the fixing member 115 and the additional reinforcing member 390 formed in the second region SR, it is possible to thereby prevent or to minimize shape deformation of the substrate 400 for a semiconductor package.

Figure 18:
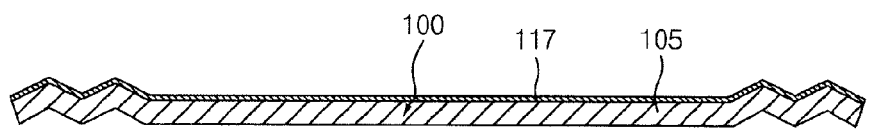
FIGS. 18 and 19 are cross-sectional views illustrating the steps of a method for fabricating a substrate for a semiconductor package shown in FIG. 16.
Figure 19:
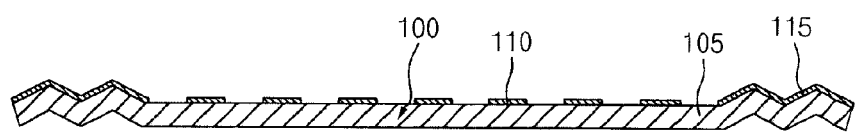

FIGS. 18 and 19 are cross-sectional views illustrating the steps of a method for fabricating a substrate for a semiconductor package shown in FIG. 16.

Referring to FIG. 18, the substrate body 100 is prepared in order to fabricate the substrate for a semiconductor package.

The substrate body 100 has, when viewed from above, a rectangular shape, and a first region FR formed with a plurality of the chip mount regions CMR and second regions SR are formed in the substrate body 100. The chip mount regions CMR are formed in the first region FR in a form of a matrix.

The first region FR is formed at a middle of the substrate body 100 and has, when viewed from above, a rectangular shape. The second region SR is formed along a periphery of the first region FR and the second region SR has, when viewed from above, a shape of a rectangular frame.

The portion of the substrate body 100 corresponding to the second region SR has the reinforcing part 105 which is bended at least one time along the second region SR. In the present embodiment, the reinforcing part 105 has a shape bent as in a zigzag shape. The reinforcing part 105 is formed along the second region SR to prevent or to minimize the shape deformation of the substrate body 100 having a thin thickness.

After the substrate body 100 formed with the reinforcing part 105 in the second region SR thereof is prepared, a metal layer 117 is formed over the upper face of the substrate body 100.

Referring to FIG. 19, after the metal layer 117 is formed over the upper face of the substrate body 100, the metal layer 117 is patterned by using a photolithography process. Therefore, the circuit pattern 110 is formed in each chip mount region CMR of the first region FR of the substrate body 100 and the fixing member 115 that covers the reinforcing part 105 is formed in the second region SR of the substrate body 100. Meanwhile, the fixing member 115 may be formed in the second region SR of the lower face of the substrate body 100 that is opposite to the upper face of the substrate body 100.

Referring again to FIG. 16, the insulation layer 200 is formed in the first region FR and the second region SR of the upper face of the substrate body 100 and the fixing member 115 formed in the second region SR and the circuit pattern 110 formed in the first region FR are thus covered by the insulation layer 200.

After the insulation layer 200 is formed in the first and second regions FR, SR of the substrate body 100, the insulation layer 200 is patterned by using a photolithography process, thereby forming an opening that exposes some portion of the circuit pattern part 110a formed in each chip mount region CMR in the portion of the insulation layer 200 corresponding to the first region FR.

After the insulation layer 200 is formed at the upper face and the lower face of the substrate body 100, the additional reinforcing member 390 having the first and third reinforcing parts 392, 396 disposed at the upper face and the lower face of the substrate body 100 and the second reinforcing part 394 facing to the side face of the substrate body 100 is coupled to the substrate body 100. The additional reinforcing member 390 further prevents or minimizes shape deformation of the substrate body 100.

Figure 20:
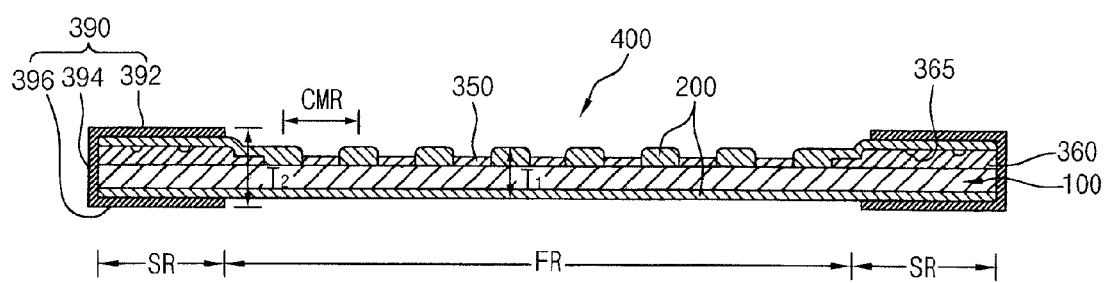
FIG. 20 is a cross-sectional view illustrating a substrate for a semiconductor package in accordance with further another embodiment of the present invention.

FIG. 20 is a cross-sectional view illustrating a substrate for a semiconductor package in accordance with further another embodiment of the present invention.

Referring to FIG. 20, the substrate 400 for a semiconductor chip includes the substrate body 100, a circuit pattern 350, the insulation layer 200 and a reinforcing member 360. In addition, the substrate 400 for a semiconductor chip further includes an additional reinforcing member 390.

The substrate body 100 has, for example, a shape of a rectangular plate having a thin thickness. The substrate body 100 includes the first region FR and the second region SR.

The first region FR is disposed, for example, at a middle of the substrate body 100. The first region FR has a shape similar to the substrate body 100 and the first region FR has an area smaller than the area of the substrate body 100. Chip mount regions CMR are formed within the first region FR and a semiconductor chip (not shown) is mounted on each chip mount region CMR.

The second region SR is disposed along a periphery of the first region FR and the second region SR has a shape of a rectangular frame when viewed from above.

The circuit pattern 350 is disposed in each chip mount region CMR formed within the first region FR of the upper face of the substrate body 100 and the circuit pattern 350 is electrically connected with a bonding pad (not shown) of the semiconductor chip (not shown). In the present embodiment, the circuit pattern 350 has a first thickness.

The reinforcing member 360 is disposed along the second region SR, and the reinforcing member 360 has a second thickness thicker than the thickness of the circuit pattern 350. In the present embodiment, the reinforcing member 360 and the circuit pattern 350 may include the same metal. Alternatively, the reinforcing member 360 and the circuit pattern 350 may include different metals from each other. The reinforcing member 360 prevents or minimizes shape deformation of the substrate body 100 having a thin thickness. Over the reinforcing member 360, a deflection preventing part 365 having a groove shape is formed along the second region SR. The deflection preventing part 365 is formed in a form of a closed loop along the second region SR.

The insulation layer 200 is disposed in the first region FR and the second region SR of the upper face of the substrate body 100. The insulation layer 200 has an opening that exposes some portion of each circuit pattern 350 formed in the first region FR. In the present embodiment, the insulation layer 200 covers the reinforcing member 360 disposed in the second region SR. Meanwhile, the insulation layer 200 may cover the first region FR and the second region SR of the lower face of the substrate body 100 that is opposite to the upper face of the substrate body 100.

The additional reinforcing member 390 is a U-shaped channel and the additional reinforcing member 390 further prevents or minimizes shape deformation of the substrate body 100. Specifically, the additional reinforcing member 390 may include a first reinforcing part 392, a second reinforcing part 394 and a third reinforcing part 396. The first reinforcing part 392 covers the second region SR of the upper face of the substrate body 100, the third reinforcing part 396 covers the second region SR of the lower face of the substrate body 100 and the second reinforcing part 394 is disposed at an upper portion of the side faces of the substrate body 100. The second reinforcing part 394 connects the first and third reinforcing parts 392, 396 with each other. In the present embodiment, the additional reinforcing member 390 may include metal.

Referring again to FIG. 20, the portion of the substrate 400 for a semiconductor package corresponding to the first region FR has a first thickness T1 and the portion of the substrate 400 for a semiconductor package corresponding to the second region SR has a second thickness T2 thicker than the first thickness T1. By the reinforcing member 360 and the additional reinforcing member 390 formed in the second region SR, it is possible to thereby prevent or to minimize shape deformation of the substrate 400 for a semiconductor package.

Figure 21:
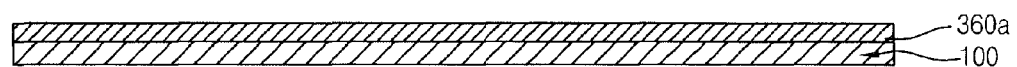
FIGS. 21 through 23 are cross-sectional views illustrating the steps of a method for fabricating a substrate for a semiconductor package in accordance with an embodiment of the present invention.
Figure 22:
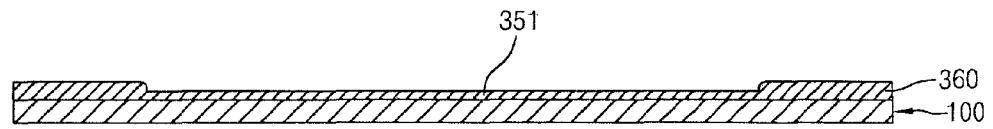
Figure 23:
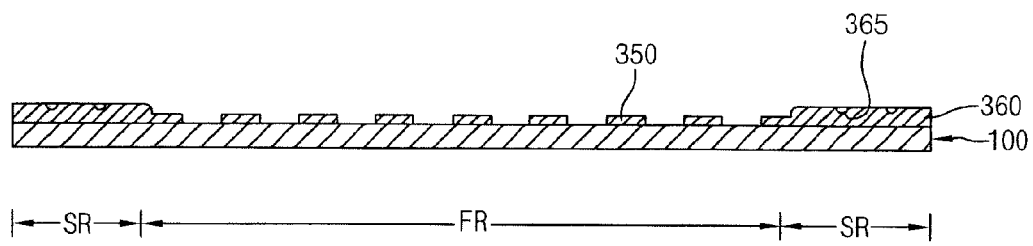

FIGS. 21 through 23 are cross-sectional views illustrating the steps of a method for fabricating a substrate for a semiconductor package in accordance with an embodiment of the present invention.

Referring to FIG. 21, the substrate body 100 is prepared in order to fabricate the substrate for a semiconductor package.

The substrate body 100 has, when viewed from above, a rectangular shape, and a first region FR formed with a plurality of the chip mount regions CMR and second regions SR are formed in the substrate body 100. The chip mount regions CMR are formed in the first region FR in a form of a matrix.

The first region FR is formed at a middle of the substrate body 100 and has, when viewed from above, a rectangular shape. The second region SR is formed along a periphery of the first region FR and the second region SR has, when viewed from above, a shape of a rectangular frame.

A metal layer 360a having a first thickness is formed in the first region FR and the second region SR of the upper face of the substrate body 100.

Referring to FIG. 22, the metal layer 360a is patterned by using a photolithography process or the like. Therefore, a preliminary circuit pattern 351 having a second thickness which is thinner than the first thickness is formed in the first region FR of the upper face of the substrate body 100 and the reinforcing member 360 is formed in the second region SR of the upper face of the substrate body 100.

Referring to FIG. 23, after the preliminary circuit pattern 351 having the second thickness is formed in the first region FR of the upper face of the substrate body 100 and the reinforcing member 360 having the first thickness thicker than the second thickness is formed in the second region SR of the upper face of the substrate body 100, the preliminary circuit pattern 351 is patterned by using a photolithography process, thereby forming circuit pattern 350 in each chip mount region CMR of the first region FR.

In the present embodiment, the circuit pattern 350 disposed adjacent to the second region SR region among the circuit patterns 350 disposed in the first region FR is formed integrally with the reinforcing member 360. As the circuit pattern 350 disposed adjacent to the second region SR region among the circuit patterns 350 disposed in the first region FR and the reinforcing member 360 are formed integrally with each other, it is possible to thereby prevent or to minimize shape deformation of the substrate body 100 having a thin thickness.

During forming the circuit pattern 350, the deflection preventing part 365 having a groove shape may be formed at the upper face of the reinforcing member 360 disposed in the second region SR. The deflection preventing part 365 is formed in a shape of a closed loop along the second region SR.

After the insulation layer 200 is formed over the substrate body 100, the additional reinforcing member 390 having the first and third reinforcing parts 392, 396 respectively disposed at the upper face and the lower face of the substrate body 100 and the second reinforcing part 394 facing to the side face of the substrate body 100 is coupled to the substrate body 100. The additional reinforcing member 390 further prevents or minimizes shape deformation of the substrate body 100.

Figure 24:
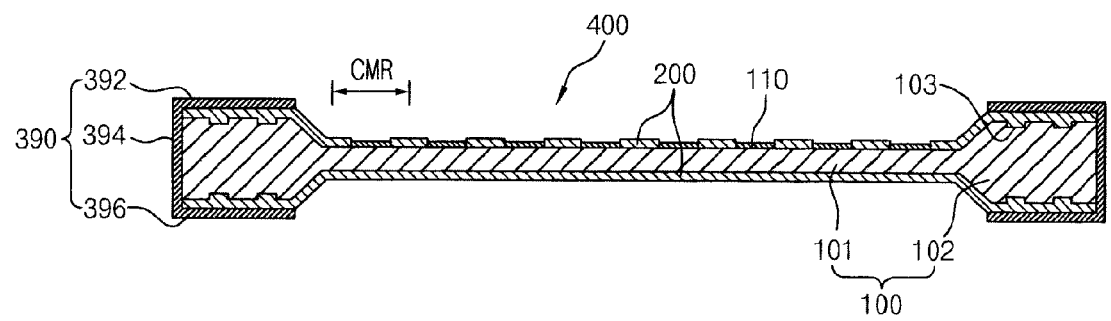
FIG. 24 is a cross-sectional view illustrating a substrate for a semiconductor package in accordance with further another embodiment of the present invention.

FIG. 24 is a cross-sectional view illustrating a substrate for a semiconductor package in accordance with further another embodiment of the present invention.

Referring to FIG. 24, the substrate 400 for a semiconductor chip includes the substrate body 100 and the insulation layer 200. In addition, the substrate 400 for a semiconductor chip further includes an additional reinforcing member 390.

The substrate body 100 has, for example, a shape of a rectangular plate having a thin thickness. The substrate body 100 includes the first region FR and the second region SR.

The first region FR is disposed, for example, at a middle of the substrate body 100. The first region FR has a shape similar to the substrate body 100 and the first region FR has an area smaller than the area of the substrate body 100. Chip mount regions CMR are formed within the first region FR and a semiconductor chip (not shown) is mounted on each chip mount region CMR.

The second region SR is disposed along a periphery of the first region FR and the second region SR has a shape of a rectangular frame when viewed from above.

The first region FR of the substrate body 100 has a first thickness and the second region SR of the substrate body 100 has a second thickness thicker than the first thickness. In the present embodiment, the second region SR having a thickness thicker than that of the first region FR prevents or minimizes shape deformation of the substrate body 100. In addition, in order to further prevent or minimize shape deformation of the substrate body 100, a deflection preventing part 103 having a groove shape may be formed in the second region SR of the substrate body 100. The deflection preventing part 103 may be formed in a shape of a closed loop along the second region SR.

The substrate body 100 includes the circuit pattern 110 and the circuit pattern 110 is disposed in each chip mount region CMR formed within the first region FR of the upper face of the substrate body 100. The circuit pattern 110 is electrically connected with a bonding pad (not shown) of the semiconductor chip (not shown).

The insulation layer 200 is disposed in the first region FR and the second region SR of the upper face of the substrate body 100. The insulation layer 200 has an opening that exposes some portion of each circuit pattern 350 formed in the first region FR. In the present embodiment, meanwhile, the insulation layer 200 may cover the first region FR and the second region SR of the lower face of the substrate body 100 that is opposite to the upper face of the substrate body 100.

The additional reinforcing member 390 is a U-shaped channel and the additional reinforcing member 390 further prevents or minimizes shape deformation of the substrate body 100. Specifically, the additional reinforcing member 390 may include a first reinforcing part 392, a second reinforcing part 394 and a third reinforcing part 396. The first reinforcing part 392 covers the second region SR of the upper face of the substrate body 100, the third reinforcing part 396 covers the second region SR of the lower face of the substrate body 100 and the second reinforcing part 394 is disposed at an upper portion of the side faces of the substrate body 100. The second reinforcing part 394 connects the first and third reinforcing parts 392, 396 with each other. In the present embodiment, the additional reinforcing member 390 may include metal, and the additional reinforcing member 390 prevents or minimizes shape deformation of the first region FR of the substrate body 100 having a thin thickness.

Figure 25:
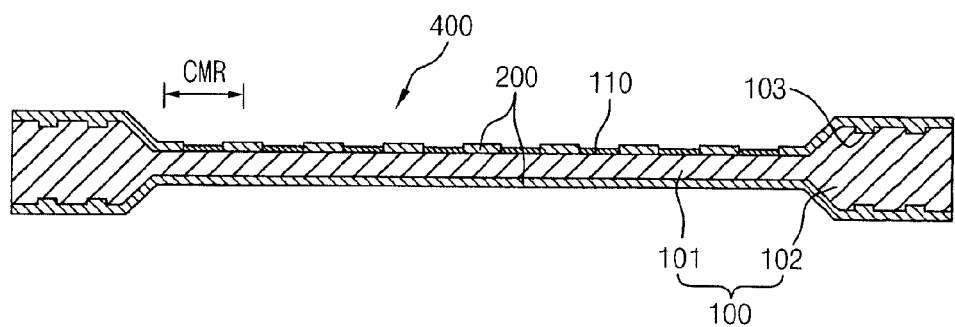
FIG. 25 is a cross-sectional view illustrating the step of a method for fabricating a substrate for a semiconductor package in accordance with an embodiment of the present invention.

FIG. 25 is a cross-sectional view illustrating the step of a method for fabricating a substrate for a semiconductor package in accordance with an embodiment of the present invention.

Referring to FIG. 25, the substrate body 100 is prepared in order to fabricate the substrate for a semiconductor package.

The substrate body 100 has, when viewed from above, a rectangular shape, and a first region FR formed with a plurality of the chip mount regions CMR and second regions SR are formed in the substrate body 100. The chip mount regions CMR are formed in the first region FR in a form of a matrix.

The first region FR is formed at a middle of the substrate body 100 and has, when viewed from above, a rectangular shape. The second region SR is formed along a periphery of the first region FR and the second region SR has, when viewed from above, a shape of a rectangular frame.

In the present embodiment, the first region FR of the substrate body 100 has a first thickness and the second region SR of the substrate body 100 has a second thickness thicker than the first thickness.

A metal layer (not shown) is formed over the upper face of the substrate body 100 and the metal layer is patterned, thereby forming circuit pattern 110 in each chip mount region CMR of the substrate body 100.

After the circuit pattern 110 is formed over each chip mount region CMR of the substrate body 100, the insulation layer 200 is formed over the upper face of the substrate body 100 and the insulation layer 200 is patterned by using a photolithography process, thereby forming an opening that exposes some portion of the circuit pattern 110.

After the insulation layer 200 is formed over the substrate body 100, the additional reinforcing member 390 having the first and third reinforcing parts 392, 396 respectively disposed at the upper face and the lower face of the substrate body 100 and the second reinforcing part 394 facing to the side face of the substrate body 100 is coupled to the substrate body 100. The additional reinforcing member 390 further prevents or minimizes shape deformation of the substrate body 100.

Figure 26:
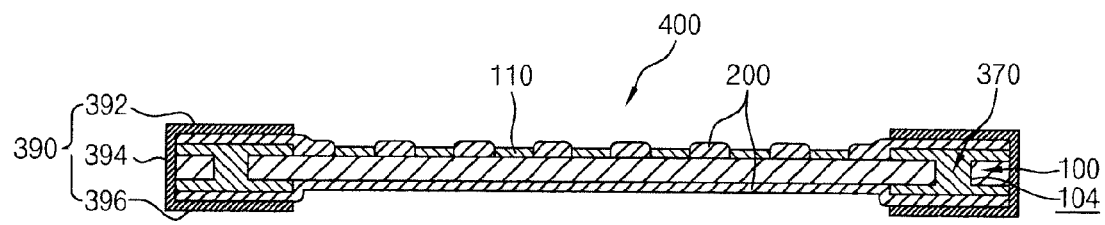
FIG. 26 is a cross-sectional view illustrating a substrate for a semiconductor package in accordance with further another embodiment of the present invention.

FIG. 26 is a cross-sectional view illustrating a substrate for a semiconductor package in accordance with further another embodiment of the present invention.

Referring to FIG. 26, the substrate 400 for a semiconductor chip includes the substrate body 100, the insulation layer 200 and a reinforcing member 370.

The substrate body 100 has, for example, a shape of a rectangular plate having a thin thickness. The substrate body 100 includes the first region FR, the second region SR, the circuit pattern 110 and through holes 104.

The first region FR is disposed, for example, at a middle of the substrate body 100. The first region FR has a shape similar to the substrate body 100 and the first region FR has an area smaller than the area of the substrate body 100. Chip mount regions CMR are formed within the first region FR and a semiconductor chip (not shown) is mounted on each chip mount region CMR.

The second region SR is disposed along a periphery of the first region FR and the second region SR has a shape of a rectangular frame when viewed from above.

The through hole 104 passes through the upper face of the substrate body 100 and the lower face of the substrate body 100 that is opposite to the upper face. The through hole 104 is disposed in plural along the second region SR and the through hole 104 may have an elliptical shape when viewed from above. The through hole 104 may have various shapes other than an elliptical shape when viewed from above.

The circuit pattern 110 is disposed in each chip mount region CMR formed within the first region FR of the upper face of the substrate body 100 and the circuit pattern 110 is electrically connected with a bonding pad (not shown) of the semiconductor chip (not shown).

The reinforcing member 370 is formed along the second region SR. The reinforcing member 370 may have, for example, insulating material or metal. The reinforcing member 370 is disposed not only within the through hole 104 but also at a surface of the second region SR. The reinforcing member 370 prevents or minimizes shape deformation of the substrate body 100 having a thin thickness.

The insulation layer 200 is disposed in the first region FR and the second region SR of the upper face of the substrate body 100. The insulation layer 200 has an opening that exposes some portion of each circuit pattern 350 formed in the first region FR. In the present embodiment, the insulation layer 200 covers the reinforcing member 370 disposed in the second region SR. Meanwhile, the insulation layer 200 may cover the first region FR and the second region SR of the lower face of the substrate body 100 that is opposite to the upper face of the substrate body 100.

The additional reinforcing member 390 is a U-shaped channel and the additional reinforcing member 390 further prevents or minimizes shape deformation of the substrate body 100. Specifically, the additional reinforcing member 390 may include a first reinforcing part 392, a second reinforcing part 394 and a third reinforcing part 396. The first reinforcing part 392 covers the second region SR of the upper face of the substrate body 100, the third reinforcing part 396 covers the second region SR of the lower face of the substrate body 100 and the second reinforcing part 394 is disposed at an upper portion of the side faces of the substrate body 100. The second reinforcing part 394 connects the first and third reinforcing parts 392, 396 with each other. The first reinforcing part 392 and the third reinforcing part 396 are disposed over the upper face and the lower face of the substrate body 100. In the present embodiment, the additional reinforcing member 390 may include metal. The additional reinforcing member 390 further prevents or minimizes shape deformation of the substrate body 100.

Figure 27:
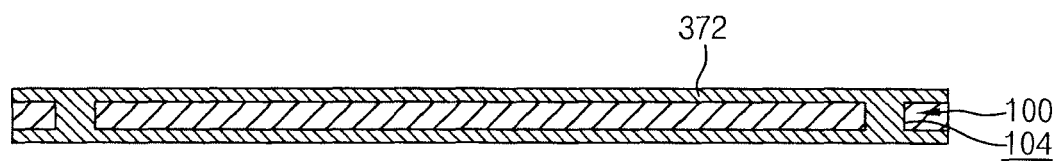
FIGS. 27 and 28 are cross-sectional views illustrating the steps of a method for fabricating a substrate for a semiconductor package shown in FIG. 26.
Figure 28:
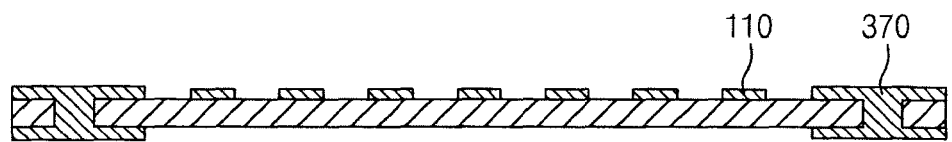

FIGS. 27 and 28 are cross-sectional views illustrating the steps of a method for fabricating a substrate for a semiconductor package shown in FIG. 26.

Referring to FIG. 27, the substrate body 100 is prepared in order to fabricate the substrate for a semiconductor package.

The substrate body 100 has, when viewed from above, a rectangular shape, and a first region FR formed with a plurality of the chip mount regions CMR and second regions SR are formed in the substrate body 100. The chip mount regions CMR are formed in the first region FR in a form of a matrix.

The first region FR is formed at a middle of the substrate body 100 and has, when viewed from above, a rectangular shape. The second region SR is formed along a periphery of the first region FR and the second region SR has, when viewed from above, a shape of a rectangular frame.

In the present embodiment, a plurality of the through holes 104 is formed in the second region SR of the substrate body 100. Each through hole 104 has, for example, an elliptical shape. In the present embodiment, each through hole may have various shapes other than an elliptical shape.

A metal layer 372 is formed over the first region FR and the second region SR of the upper face of the substrate body 100. The metal layer 372 covers the upper face of the substrate body 100 and the lower face of the substrate body 100 that is opposite to the upper face and fills the through hole 104.

The metal layer 372 is patterned by using a photolithography process. Therefore, the circuit pattern 110 is formed in each chip mount region CMR of the substrate body 100 and the reinforcing member 370 that fills the through hole 104 is formed in the second region SR.

After the circuit pattern 110 is formed in each chip mount region CMR of the substrate body 100, the insulation layer 200 is formed over the upper face of the substrate body 100 and the insulation layer 200 is patterned by using a photolithography process, thereby forming an opening that exposes some portion of the circuit pattern 110.

After the insulation layer 200 is formed over the substrate body 100, the additional reinforcing member 390 having the first and third reinforcing parts 392, 396 respectively disposed at the upper face and the lower face of the substrate body 100 and the second reinforcing part 394 facing to the side face of the substrate body 100 is coupled to the substrate body 100. The additional reinforcing member 390 further prevents or minimizes shape deformation of the substrate body 100.

As is apparent from the above description, it is possible to thereby prevent or to minimize shape deformation of the substrate body by forming reinforcing members of the edge of the substrate body having a very thin thickness.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A substrate for a semiconductor package, comprising:
   a substrate body provided with a first region having a plurality of chip mount regions, a second region disposed along a periphery of the first region, a circuit pattern disposed in each chip mount region, and a dummy pattern disposed along the second region;
   an insulation layer which covers the first and second regions and which has an opening that exposes a portion of each circuit pattern; and
   a reinforcing member disposed in the second region and which substantially prevents or minimizes any deflections or distortions of the substrate body.

2. The substrate according to claim 1, wherein the reinforcing member is disposed over the portion of the insulation layer corresponding to the second region.

3. The substrate according to claim 2, wherein the insulation layer and the reinforcing member include the same material.

4. The substrate according to claim 2, wherein the insulation layer includes a first insulating material having a first hardness and the reinforcing member includes a second insulating material having a second hardness which is harder than the first hardness.

5. The substrate according to claim 1, wherein the reinforcing member is disposed between the dummy pattern and the insulation layer.

6. The substrate according to claim 1, wherein the reinforcing member includes a metal layer.

7. The substrate according to claim 1, wherein the reinforcing member has a deflection preventing groove formed along the second region.

8. The substrate according to claim 1, wherein the reinforcing member is disposed over a first face of the substrate body formed with the insulation layer and over a second face of the substrate body opposite to the first face.

9. The substrate according to claim 1, further comprising a first reinforcing part substantially facing the second region of an upper face of the substrate body, a third reinforcing part substantially facing the second region of a lower face of the substrate body and a second reinforcing part connecting together the first and third reinforcing parts.

10. A method for fabricating a substrate for a semiconductor package, comprising the steps of:
preparing a substrate body which is provided with a first region having a plurality of chip mount regions, a second region disposed along a periphery of the first region, a circuit pattern disposed in each chip mount region and a dummy pattern disposed along the second region;
forming an insulation layer, which covers the first and second regions and which has an opening that exposes portions of each circuit pattern, over the substrate body; and
forming a reinforcing member, which substantially prevents or minimizes deflections of the substrate body, in the second region.

11. The method according to claim 10, wherein in the step of forming the reinforcing member, the reinforcing member is formed over the insulation layer.

12. The method according to claim 11, wherein the insulation layer and the reinforcing member are formed of the same material.

13. The method according to claim 11, wherein the insulation layer includes a first insulating material having a first hardness and the reinforcing member includes a second insulating material having a second hardness which is harder than the first hardness.

14. The method according to claim 11, further comprising a step of forming an additional reinforcing member over the portion of the insulation layer corresponding to the second region.

15. The method according to claim 11, wherein in the step of forming the reinforcing member, the reinforcing member is formed directly over the dummy pattern.

16. The method according to claim 11, wherein in the step of forming the reinforcing member, the reinforcing member is a metal layer.

17. The method according to claim 16, further comprising a step of forming a deflection preventing groove over the reinforcing member along the second region.

18. A method for fabricating a substrate for a semiconductor package, comprising the steps of:
preparing a substrate body having a first region having a plurality of chip mount regions and having a second region disposed along a periphery of the first region;
forming a reinforcing member along the second region;
forming a metal layer in the first and second regions and which covers the reinforcing member;
forming a circuit pattern part in each chip mount region and a reinforcing pattern part covering an upper face of the reinforcing member by patterning the metal layer; and
forming an insulation layer which covers the first region and which has an opening that exposes a portion of the circuit pattern.

19. The method according to claim 18, wherein in the step of forming the reinforcing member, the reinforcing member is any one of an insulation layer and a metal layer formed over the portion of the substrate body corresponding to the second region.

20. A method for fabricating a substrate for a semiconductor package, comprising the steps of:
preparing a substrate body having a first region having a plurality of chip mount regions and having a second region disposed along a periphery of the first region;
forming a metal layer covering the first and second regions;
forming a reinforcing pattern with a first thickness over the portion of the substrate body corresponding to the second region and forming a preliminary circuit pattern part with a second thickness which is thinner than the first thickness over the portion of the substrate corresponding to each chip mount region by patterning the metal layer;
forming a circuit pattern in each chip mount region by patterning the preliminary circuit pattern part; and
forming an insulation layer which covers the first region and which has an opening that exposes a portion of the circuit pattern.

21. The method according to claim 20, wherein in the step of forming the reinforcing pattern, a deflection preventing groove is formed over an upper face of the reinforcing member along the second region.

22. A method for fabricating a substrate for a semiconductor package, comprising the steps of:
preparing a substrate body which is provided with a chip mount part having a first thickness and formed with a plurality of chip mount regions and a reinforcing pattern part formed along an edge of the chip mount part and having a second thickness thicker than the first thickness;
forming a circuit pattern in each chip mount region; and
forming an insulation layer which covers the chip mount region and which has an opening that exposes a portion of the circuit pattern.

23. The method according to claim 22, wherein the step of preparing the substrate body includes the steps of:
preparing a preliminary substrate having the second thickness; and
forming the chip mount part having the first thickness by etching the portion of the preliminary substrate corresponding to the chip mount part.

24. The method according to claim 22, wherein the step of preparing the substrate body includes a step of forming a groove over the upper face of the reinforcing pattern part along the reinforcing pattern part.

25. A method for fabricating a substrate for a semiconductor package, comprising the steps of:
forming a substrate body which includes a first region having a plurality of chip mount regions, and which includes a second region disposed along the periphery of the first region and which has through holes passing through the second region;
forming a reinforcing member which fills the through holes and covers the second region; and
forming an insulation layer which covers the first region.

26. The method according to claim 25, wherein in the step of forming a reinforcing member, the reinforcing member is an insulator.

27. The method according to claim 25, wherein the step of forming the reinforcing member includes the steps of:
forming metal layer covering the first and second regions; and
forming a circuit pattern in each chip mount region by patterning the metal layer.

* * * * *